(12) United States Patent
Bauwens et al.

(10) Patent No.: US 6,704,893 B1
(45) Date of Patent: Mar. 9, 2004

(54) METHOD FOR TESTING INTEGRATED CIRCUITS WITH AN AUTOMATIC TEST EQUIPMENT

(75) Inventors: Peter Bauwens, Oudenaarde (BE); Anton Chichkov, Oudenaarde (BE)

(73) Assignee: Alcatel, Paris (FR)

( * ) Notice: Subject to any disclaimer, the term of this patent is extended or adjusted under 35 U.S.C. 154(b) by 631 days.

(21) Appl. No.: 09/638,904

(22) Filed: Aug. 15, 2000

(30) Foreign Application Priority Data

Sep. 14, 1999 (EP) ............................................ 99402253

(51) Int. Cl.[7] .......................... G01R 31/28; G06F 11/00
(52) U.S. Cl. ....................................... 714/724; 714/744
(58) Field of Search .................................. 714/724, 744

(56) References Cited

U.S. PATENT DOCUMENTS

| | | | |
|---|---|---|---|
| 5,446,742 A | | 8/1995 | Vahabi et al. |
| 5,566,188 A | * | 10/1996 | Robbins et al. ............... 714/744 |
| 5,689,515 A | * | 11/1997 | Panis .......................... 714/724 |
| 5,854,797 A | * | 12/1998 | Schwartz et al. ............ 714/724 |
| 5,905,967 A | * | 5/1999 | Botham ........................ 702/118 |
| 6,469,493 B1 | * | 10/2002 | Muething et al. ........... 324/158.1 |

FOREIGN PATENT DOCUMENTS

EP  0 460 603 A2  12/1991

OTHER PUBLICATIONS

"Optimal Use of Timing Resources: A Crucial Step in Test Program Generation" Chang et al. International Test Conference, 1988. Proceedings. 'New Frontiers in Testing' Sep. 12–14, 1988 Page(s): 460–465.*

"Towards A Standardized Procedure for Automatic Test Equipment Timing Accuracy Evaluation" Cai et al. International Test Conference Proceedings., Sep. 28–30, 1999 Page(s): 509–517.*

"A Test Structure for Transferring Timing Setup Between Digital IC Testers" Allodi et al. Proceedings of the International Conference on Microelectronic Test Structures, ICMTS 1993, Mar. 22–25 1993 Page(s): 223–226.*

Spanier, P. et al: "Transforming Logic Simulator Output to Tester Timing Descriptions" Microprocessing and Microprogramming, NL, Elsevier Science Publishers, BV., Amsterdam, col. 28, No. 1/05, Mar. 1, 1990, pp. 291–294, XP000134059 ISSN: 0165–6074.

* cited by examiner

*Primary Examiner*—Albert Decady
*Assistant Examiner*—Cynthia Britt
(74) *Attorney, Agent, or Firm*—Sughrue Mion, PLLC

(57) ABSTRACT

An automatic test equipment is used to test integrated circuits. The test comprises applying signals to each input pin of the circuit at predetermined timings and in detecting output signals at the output pins of the circuit at predetermined timings. Each succession of timings, or time-plates, for an input pin and the corresponding output pin is controlled by a timing generator in the test equipment. When the number n of time-plates is greater than the number m of timing generators, the test is realized in several steps. The timing generators, which are reused for other time-plates during a second or further step, are selected in a way that minimizes testing time. The timing generators which are reused are those which require a minimum number of programming changes from the time-plate implemented during the first step.

9 Claims, 1 Drawing Sheet

METHOD FOR TESTING INTEGRATED CIRCUITS WITH AN AUTOMATIC TEST EQUIPMENT

BACKGROUND OF THE INVENTION

The invention relates to a method for testing integrated circuits with an automatic test equipment.

Integrated circuits (IC) include generally a great number of electronic components, usually more than several hundred thousands. As the design and manufacture of such circuits are very complex operations, automatic tools are available for this design and manufacture. For instance, software design tools are available to establish schematic diagrams of the desired integrated circuit and simulation software (or simulator) is also used to check the operation of the circuit before its manufacture.

After manufacture, automatic test equipments (ATE) are available for testing the operation and the possible defects of the integrated circuit. The test consists in the application of test signals to input pins and in the measurement of the corresponding signals obtained at the output pins in order to check whether they have or not the expected values. More precisely, at a given time, a set of signals.(or values) is applied to the input pins and, after certain delay, for instance 30 nanoseconds (ns), a new set of values is applied to the input pins, etc. The timings of the signals and the delays are variable according to the test to be performed.

A set of values at a given time on the inputs is designated as a vector and the succession in time of vectors is called a test pattern.

The test patterns are established during the design of the circuit with the help of the simulator or automatic test pattern generators.

The timings of one signal, to be applied to one input, or to be detected at one output, is called here a "time-plate". In other words, a time-plate is a succession of times at which signal changes occur. For instance, a time-plate is 0 ns, 10 ns, 50 ns for a period of 100 ns.

Generally, a test pattern comprises a great number of time-plates, typically from 40 to 100. Each time-plate is controlled by a timing generator (sometimes called a time-set) which is a physical device inside the automatic test equipment. Each timing generator must also control the signal values.

But this automatic test equipment has a limited number of timing generators. Usually, the number of time-plates used by a test program or pattern exceeds the number of timing generators available in the automatic test equipment. In order to cope with this discrepancy, the ATE is programmed in order to work in several steps. During a first step, the ATE uses all the available timing generators and during a further step, or several further steps, the timing generators are reused in order to implement all the time-plates which are necessitated by the test program of the integrated circuit under test.

To reuse a timing generator means to reprogram it in order that it corresponds to the timings of the time-plate and to the new signal values.

For instance if the ATE has 16 timing generators and the test program involves 40 different time-plates, during a first step, 16 time-plates are implemented on the 16 available timing generators; during an intermediate step, the 16 timing generators are reprogrammed in order to implement 16 other time-plates which are used during a second step of the test program; afterwards, during a further intermediate step, 8 timing generators are reprogrammed to implement the remaining 8 time-plates which will run during the last step of the test program or pattern.

SUMMARY OF THE INVENTION

The invention starts from the recognition that the testing time depends on the way the timing generators are reprogrammed in the ATE. In the example above where an ATE has 16 available timing generators and the number of time-plates of the test program is 40, the number of possible mappings between timing generators and time-plates is the number of possible combinations of m=16 timing generators among n=40 time-plates, i.e. $C_n^m$. This number $C_{40}^{16}$ is greater than 60 billions. Each of the possible combinations requires different testing times. The actual number of possibilities is usually less than $C_n^m$ because there are some restrictions in the choice of the combinations. For instance, some tests must be performed before others. However, in spite of these restrictions, the number of possible combinations is very big.

According to known technologies, the choice of the combinations is realized "manually", i.e. left to the appreciation of a programmer. It has been observed by the inventors that the testing time may vary in significant proportions in function of the selected combinations.

Therefore, the invention provides a method for reusing the timing generators which minimizes the testing time. It is to be noted that the prior art does not address this problem and, for this reason, does not provide any method for minimizing the testing time in case the number of timing generators is inferior to the number of time-plates.

The invention concerns a method for testing integrated circuits by the use of an automatic test equipment, the testing consisting in applying to each input pin signals at determined timings and in detecting the output signals at the output pins at predetermined timings, wherein each succession of timings, or time-plates, for an input pin and the corresponding output pin is controlled by a timing generator in the automatic test equipment and wherein, when the number n of time-plates is superior to the number m of timing generators, the test is realized in several steps, timing generators being reused for implementing other time-plates during a second or further step. It is characterized in that, in order to minimize the testing time, the timing generators which are reused during the second step are timing generators which impose a minimum number of programming changes from the time-plate implemented during the first step to the time-plate implemented for the second step.

A reprogramming change is a change of timing and/or a change of format. For instance, if one timing generator is programmed for a time-plate for which the timings are 0, 20, 50 ns for instance and if there is another time-plate with the same timings which has not been implemented during the first step of test, then, this timing generator will be reused with the same time-plates and there will be no time required for the reprogramming. If there is no further time-plate with the same timings but, instead, for instance, a time-plate with 0, 20, 70 ns and another time-plate with 0, 30, 70 ns, then the first one will be selected because it necessitates only one change (from 50 to 70 ns) of time parameter instead of two changes of time parameters (from 20 to 30, and from 50 to 70), in the second case.

In fact, it has been observed that the smaller the number of time and signal parameters to be changed, the smaller is the time for the change and, therefore, the testing time is the smaller.

With this method, the testing time may be reduced about 20% with respect to the testing time obtained with the mapping of time-plates to timing generators realized "manually", i.e. left to the appreciation of the programmer.

Preferably, the number of changes to be counted for the selection of the timing generators to be reprogrammed is the addition of timing changes and of format changes.

The testing method according to the invention is preferably realized in the form of a computer program controlling the automatic test equipment. This computer program may be produced automatically by the following method:

For every possible couple of time-plates, the number of changes to be implemented in order to convert one time-plate to the other is determined, and the timing generators which will be reused from one step to the next step and the time-plates which will be implemented in these timing generators are those for which the number of changes is minimum in order to convert the time-plate used during the said one step to the time-plate used during the next step.

Preferably, the said number for all couples are kept in a memory in order to be used sequentially.

The couples of time-plates may have the form of a symmetrical matrix wherein the lines and columns are identical and correspond to the time-plates.

It will be appreciated that the method for automatically determining the test program is much faster than the conventional empirical method.

The invention concerns also a method for manufacturing an integrated circuit comprising a testing step as described herein above.

The invention relates also to an automatic test equipment for integrated circuits, which comprises means for applying to each input pin of the circuit, signals at determined timings, means for detecting the output signals at the output pins at predetermined timings, timing generators, the function of each of these timing generators being to control the succession of timings, or time-plates, for an input pin and the corresponding output pin, and means for realizing the test in several steps, when the number n of time-plates is superior to the number m of timing generators, said means for realizing the test in several steps comprising means for reusing timing generators for implementing other time-plates during a second or further step. This equipment is characterized in that the means for reusing the timing generators comprise, in order to minimize the testing time, means for determining the timing generators which impose a minimum number of programming changes from the time-plate implemented during the first step to the time-plate implemented for the second step.

In an embodiment, the means for determining the timing generators which impose a minimum of programming changes comprise means for adding the number of timing changes and the number of format changes.

BRIEF DESCRIPTION OF THE DRAWINGS

Other features and advantages of the invention will appear with the description of certain of its embodiments, this description being made in connection with the following drawings, wherein.

DETAILED DESCRIPTION OF THE INVENTION

Although tests are of current practice during production of integrated circuits, more particularly of large scale integrated circuits, it is recalled here that tests are necessary in order to check, during production, the correct operation of the manufactured circuits, and to detect defects. These tests are prepared during the design of the circuits.

For the design of circuits as well as for the tests, commercial tools are available in order to help the designer in this task. However most of these tools are suitable for the design, the specification and the validation $IC_S$, but up to now, the few tools which are available for the generation of test programs do not provide optimal tests.

Figure 1:
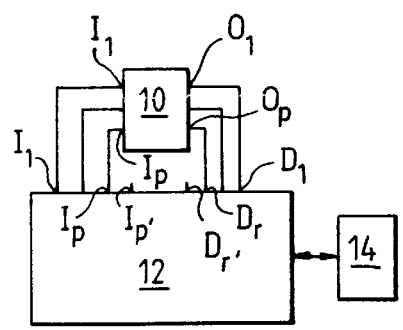
FIG. 1 is a schematic representation of an automatic test equipment and of an integrated circuit under test.

As represented on FIG. 1, an integrated circuit 10 under test comprises input pins $I_1 \ldots I_p$ and output pins $O_1 \ldots O_r$. For testing this circuit 10, use is made of an automatic test equipment 12 having a plurality of terminals $T_1 \ldots T_{p'}$ for providing test signals to the inputs $I_1 \ldots I_p$ of the circuit 10 and a plurality of terminals $D_i \ldots D_{r'}$ for detecting the signals obtained at the outputs $O_1 \ldots O_r$. The number p' of terminals $T_i$ and the number r' of terminals $D_j$ of the equipment 12 is greater to respectively the number p and r of the circuit 10 under test because the automatic test equipment 12 is designed to be used with different kinds of circuits, having different numbers of pins.

The equipment 12 is associated with a computer 14, the role of which is to implement and control the test program on the equipment 12, and to control the results of the test.

The signals which are generated or detected on the terminals $T_i$ and $D_j$ must have a given value and a precise timing. These values and timings have a standardized format Wgl. The values may be of any format. In the present example, the format is a return to zero (RZ) or a non return to zero (NRZ).

For instance, a test pattern for an input $I_i$ has the RZ format with a signal of value zero at 0 ns, a period of 100 ns, the test signal S is applied at 10 ns and the signal returns to zero after 50 ns. In this example, at the corresponding output pin $O_j$, the output signal Q is detected at 90 ns. If this output signal has the expected value, there is no defect (if the test is a defect test) and if this signal has a different value than expected, this is an indication of a defect.

For controlling the timings and values of these input and output signals, the automatic test equipment 12 is provided with a plurality of timing generators (not represented in detail), each of which controlling the timings and values of input signals and the timings of the corresponding output signals. In the above-mentioned example, one timing generator controls the inputs at times 0, 10 and 50 ns and controls the outputs at times 0 and 90 ns.

For a given test, there are n patterns, i.e. n times-plates and for each time-plate, a corresponding format. Each time-plate must be implemented on a timing generator. But, in general, more particularly for digital circuits, the number n exceeds the number m of timing generators available in the equipment 12. It is the reason why tests are realized sequentially: in a first step, m time-plates among the n time-plates of the test are implemented on m corresponding timing generators. Afterwards, during one (or more) further step, other timing generators are reused in order to implement the remaining n–m time-plates.

According to the invention, the time-plates which are implemented during the next step are those which minimize reprogramming of the corresponding timing generators. More precisely, if during the first step, a given time-plate is implemented on a given timing generator, this given timing generator will be reused during the next step for implementing a time-plate which has minimum changes with respect to the given time-plate which was implemented during the first step.

For the understanding of this method, a simplified example is given here:

It is supposed that the circuit 10 under test has only one input pin and one output pin and, also, that the automatic test equipment has only two timing generators. However, the test program has 4 time-plates which are organized in two Wgl files, each corresponding to two time-plates. It is recalled here that a Wgl file is the combination of timing and signal values.

Each time-plate has a period of 100 ns.

The first Wgl file, a, has two time-plates $a_1$ and $a_2$ which are as follows:
1) $a_1$.
It has the RZ format.
For the input: at 0 ns, signal D (for "drive down", or zero), at 10 ns, signal S, i.e. the signal imposed by the test pattern, and at 50 ns return to D.
For the output: at 0 ns, no measurement of signal, and the measurement is performed at 90 ns (signal Q).
2) $a_2$.
It has the NRZ format.
For the input, signal S (test signal) appears at 0 ns.
For the output, the measurement is performed (Q) at 90 ns.

The second Wgl file, b, has also two time-plates $b_1$ and $b_2$, the first one, $b_1$, corresponding to an input with a RZ format and the second, $b_2$, corresponding to an output with a NRZ format.

1—For time-plate $b_1$, the timings are: Input: signal D at 0 ns, signal S (of test pattern) at 20 ns, and back to signal D at 80 ns.
For the output, the measurement is performed at 90 ns.
2—For time-plate $b_2$ (with the RNZ format):
At the input, the signal S is established at 0 ns; at the output, the measurement is made at 80 ns.

In view of the timing and format features of all time-plates and in view of constraints linked to the test program (explained after), the different possibilities of reuse of timing generators are as follows:
1°/ The change from $a_1$ to $a_2$ or from $a_2$ to $a_1$ is not possible because in this example, $a_2$ and $a_1$ may run simultaneously in the test program.
2°/ Change from $a_1$ to $b_1$ or vice-versa.
The timing 10 ns has to be changed to 20 ns and the timing 50 ns has to be changed to 80 ns for the input, no change is necessary for the output. Moreover, the formats of the signals are the same. In this case, the number of parameters to be changed is 2.
3°/ $a_2$ to $b_1$ or $b_1$ to $a_2$. The number of changes is 3: 1 for the format and 2 for the timings (input).
4°/ $a_2$ to $b_2$ or vice-versa. The format is the same and there is only one timing change for the output. Therefore, the number of changes is 1.
5°/ The change from $b_1$ to $b_2$ or vice-versa is not possible for the same reason as in case n°1.

The reprogrammings which will be selected are those from which the number of changes is minimum. The lowest is the change from $a_2$ to $b_2$ and the second lower is $a_1$ to $b_1$. Therefore, $a_1$ and $b_1$ will use the first timing generator, and $a_2$ and $b_2$ will use the second timing generator.

All these changes may be summarized in the herein below matrix, or two dimensional array:

|   | "$a_1$" | "$a_2$" | "$b_1$" | "$b_2$" |
|---|---|---|---|---|
| "$a_1$" | 0 | −1 | 2 | 4 |
| "$a_2$" | −1 | 0 | 3 | 1 |
| "$b_1$" | 2 | 3 | 0 | −1 |
| "$b_2$" | 4 | 1 | −1 | 0 |

In this matrix, "−1" means an impossible transformation as explained herein above.

With the above-mentioned method, due to the fact that the minimum reprogramming is selected, testing time is minimized.

Figure 2:
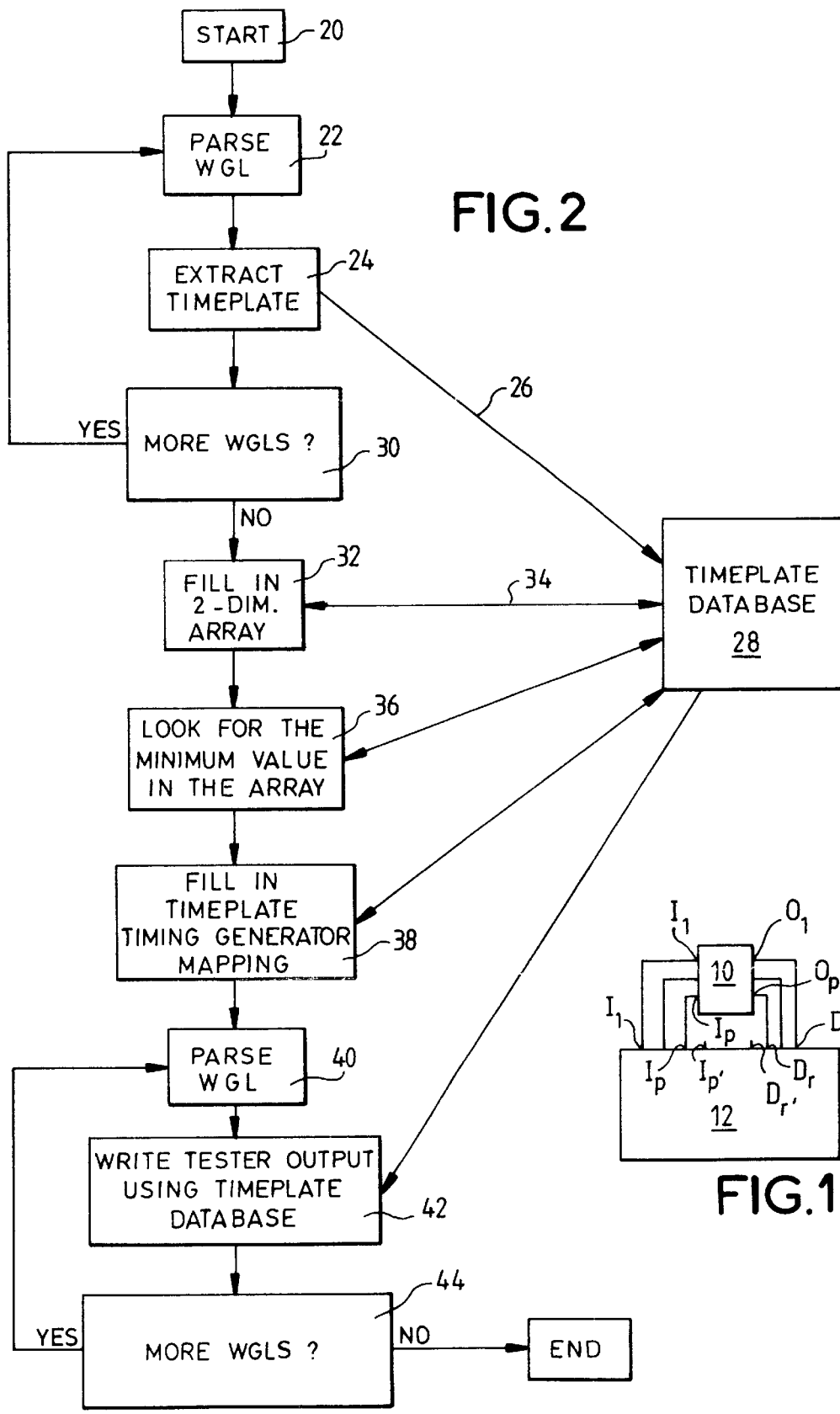
FIG. 2 is a flowchart showing the steps of a program controlling the method according to the invention.

The programming of equipment 12 for each particular integrated circuit may be produced automatically according to the flowchart represented on FIG. 2. It is pointed out that this flowchart is an integral part of the present description.

After the start (step 20), the Wgl files are parsed, i.e. read selectively (step 22). In other words, the program considers first Wgl number 1, afterwards Wgl number 2, etc.

Afterwards, for each Wgl, for instance for the first Wgl which is read at the beginning of the program, the program has a further step 24 during which time-plates are extracted from this first Wgl.

The extracted time-plates are stored (arrow 26) in a time-plate database 28.

During step 30, after step 24, it is checked whether all Wgl have been considered or not.

After the reading of all Wgl, a two-dimensional array (matrix) is filled (step 32) by using the content of the time-plate database 28 (double arrow 34). This matrix gives for each couple of time-plates, the number of times and format changes which are necessary to transform one time-plate into the other time-plate. The smaller this number the lower is the time necessary for reprogramming the corresponding timing generator and, therefore, the lower is the contribution of this change to the total testing time.

The matrix is stored in the database 28.

Afterwards, the program (step 36) selects the minimum number in the matrix or two-dimensional array.

After the step 36 during which the program selected the minimum number inside the matrix, the two-dimensional array is modified in order to take into account this selection: the corresponding timing generator is already in use for the second step. This corresponds to step 38 (fill-in time-plate—timing generator table). The steps 36 and 38 are repeated until all time-plates of the test program are implemented with an indication of the timing or step when the corresponding timing generator will be reprogrammed.

Eventually, the program makes a new check of Wgl: step 40 in order to take into account the signal values and the combination of values and timing is implemented in the equipment 12 (step 42). This check is made for all Wgls (step 44).

In an embodiment, the final test program is implemented in a processing unit in the automatic test equipment and the program as described with FIG. 2 is also implemented in the same processing unit or another unit in the test equipment. The program according to the invention may be realized with several software modules which the person skilled in the art will have no difficulty to realize.

What is claimed is:

1. A method for testing integrated circuits by the use of an automatic test equipment, the testing comprising applying to each input pin signals at determined timings and in detecting the output signals at the output pins at predetermined timings, wherein each succession of timings, or time-plates, for an input pin and the corresponding output pin is controlled by a timing generator in the automatic test equipment and wherein, when the number n of time-plates is superior to the number m of timing generators, the test is realized in several steps, timing generators being reused for implementing other time-plates during a second or further step, wherein, in order to minimize the testing time, the timing generators which are reused during the second step are timing generators which impose a minimum number of programming changes from the time-plate implemented during the first step to the time-plate implemented for the second step.

2. A method according to claim 1, wherein the number of changes to be counted for the selection of the timing generators to be reprogrammed is the addition of timing changes and of format changes.

3. A method according to claim 1, wherein the time-plates which will be used during successive steps remain implemented on the same timing generator.

4. A method according to claim 1, wherein, in order to select the timing generators which will be reused during the further step(s), for every possible couple of time-plates, the number of changes to be implemented in order to convert one time-plate to the other is determined, and the timing generators which will be reused from one step to the next step and the time-plates which will be implemented in these timing generators are those for which the number of changes is minimum in order to convert the time-plate used during the said one step to the time-plate used during the next step.

5. A method according to claim 4, wherein said number for all couples are kept in a memory in order to be used sequentially.

6. An automatic test equipment for testing integrated circuits comprising means for applying to each input pin of the integrated circuit, signals at determined timings, means for detecting the output signals at the output pins at predetermined timings, timing generators, each of these timings generators having the function to control the succession of timings, or time-plates, for an input pin and the corresponding output pin, and means for realizing the test in several steps when the number n of time-plates is superior to the number m of timing generators, said means for realizing the test in several steps comprising means for reusing timing generators for implementing other time-plates during a second or further step, wherein the means for reusing the timing generators comprise, in order to minimize the testing time, means for determining the timing generators which impose a minimum number of programming changes from the time-plate implemented during the first step to the time-plate implemented for the second step.

7. An automatic test equipment according to claim 6, wherein the means for determining the timing generators which impose a minimum of programming changes, comprise means for adding the number of timing changes to the number of format changes.

8. An automatic test equipment according to claim 6, wherein the means for determining the timing generators which impose a minimum number of programming changes, comprise means for using the same timing generator for time-plates used during successive steps.

9. A method for manufacturing an integrated circuit comprising a testing step making use of an automatic test equipment, the testing consisting in applying to each input pin signals at determined timings and in detecting the output signals at the output pins at predetermined timings, wherein each succession of timings, or time-plates, for an input pin and the corresponding output pin is controlled by a timing generator in the automatic test equipment and wherein, when the number n of time-plates is superior to the number m of timing generators, the test is realized in several steps, timing generators being reused for implementing other time-plates during a second or further step, wherein, in order to minimize the testing time, the timing generators which are reused during the second step are timing generators which impose a minimum number of programming changes from the time-plate implemented for the first step to the, time-plate implemented for the second step.

* * * * *